United States Patent [19]

Kuhara et al.

[11] Patent Number: 5,542,018
[45] Date of Patent: Jul. 30, 1996

[54] SEMICONDUCTOR LASER DEVICE MAKING USE OF PHOTODIODE CHIP

[76] Inventors: Yoshiki Kuhara; Hiromi Nakanishi; Ichiro Tonai; Kazuhito Murakami, all of c/o Osaka Works of Sumitomo Electric Industries, Lt. 1-3, Shimaya 1-chome, Konohana-ku, Osaka, Japan

[21] Appl. No.: 120,456

[22] Filed: Sep. 14, 1993

Related U.S. Application Data

[63] Continuation-in-part of Ser. No. 12,474, Feb. 2, 1993, and Ser. No. 50,720, Apr. 8, 1993, Pat. No. 5,304,824, which is a continuation of Ser. No. 751,188, Aug. 29, 1991, abandoned.

[30] Foreign Application Priority Data

Aug. 31, 1990 [JP] Japan ................................. 2-230206
Feb. 3, 1992 [JP] Japan ................................. 4-017625

[51] Int. Cl.⁶ .................................................. G02B 6/36
[52] U.S. Cl. .................... 385/92; 257/184; 257/196; 257/201; 257/459; 385/93; 372/43; 372/50; 372/36
[58] Field of Search .................. 257/201, 98, 99, 257/432, 433, 434, 448, 459, 461, 463, 464, 184, 196; 385/88–94; 372/43, 50, 36

[56] References Cited

U.S. PATENT DOCUMENTS

| | | | |
|---|---|---|---|
| 4,152,713 | 5/1979 | Copeland, III et al. | 257/98 |
| 4,222,629 | 9/1980 | Passele et al. | 385/94 |
| 4,357,072 | 11/1982 | Goodfellow et al. | 385/94 |
| 4,847,848 | 7/1989 | Inoue et al. | 372/50 |
| 4,914,301 | 4/1990 | Akai | 257/461 |
| 4,989,051 | 1/1991 | Whitehead et al. | 257/432 |
| 4,996,169 | 2/1991 | Lee | 372/43 |
| 5,144,396 | 9/1992 | Sargood | 257/461 |

FOREIGN PATENT DOCUMENTS

| | | |
|---|---|---|
| 436380A3 | 2/1992 | European Pat. Off. |
| 473198A1 | 3/1992 | European Pat. Off. |
| 60-193385 | 1/1985 | Japan |
| 60-192382 | 12/1986 | Japan |
| 2-065279 | 5/1990 | Japan |
| 2-214171 | 8/1990 | Japan |
| 2-137389 | 8/1990 | Japan |
| 2-297988 | 2/1991 | Japan |
| 3-048209 | 5/1991 | Japan |

OTHER PUBLICATIONS

IEE Proceedings Journal of Optoelectronics, vol. 137, Pt.J, No. 3, entitled "High Quantum Efficiency $p^+/\pi/n^-/n^+$ silicon photodiode," by Yin et al, dated Jun. 1990.

Primary Examiner—Georgia Y. Epps
Assistant Examiner—John Ngo

[57] ABSTRACT

A semiconductor laser device in which a housing with an optical fiber inserted in is secured to a header with a semiconductor laser chip mounted on is integrated, the light emitting surface of the semiconductor laser chip and the end surface of the optical fiber are opposed to each other, and there is provided a photodiode chip for detecting the signal light emitted from the backside (rear end surface) of the light emitting surface of the semiconductor laser chip, in the top incidence type photodiode chip having a pn junction area of the structure as a photo-sensing region, the first region is surrounded by a second region of the second conductivity type formed at a portion of the semiconductor layer. The second region has the same or larger depth as or than that of the first region. Thus, even if a light is directed to the outside of the photo-sensing region, extra charges into the photo-sensing region is prevented.

30 Claims, 13 Drawing Sheets

5,542,018

SEMICONDUCTOR LASER DEVICE MAKING USE OF PHOTODIODE CHIP

RELATED APPLICATIONS

This is a continuation-in-part of (1) application Ser. No. 08/050,720 filed on Apr. 8, 1993, now U.S. Pat. No. 5,304,824, which is a continuation of application Ser. No. 07/751,188 filed on Aug. 29, 1991, now abandon; and (2) application Ser. No. 08/012,474, filed on Feb. 2, 1993, now pending.

BACKGROUND OF THE INVENTION

1. Field of the Invention

This invention relates to a semiconductor laser device used in transmission devices, etc. of the optical communication systems.

2. Related Background Art

The semiconductor laser device used in the optical communication using optical fibers is exemplified by the one as shown in FIG. 1 (a first prior art) which comprises a semiconductor laser chip 1A as a signal light source and a photodiode chip 1B as light detecting means for monitoring the light emitted from the rear end surface (lower end surface as viewed in FIG. 1) of the semiconductor laser chip 1A which is mounted on a header 2, and lead wires 3 connecting the photodiode chip 1B to a monitor circuit and connecting the semiconductor laser chip to an outside drive circuit (not shown).

In FIG. 1, a cap 4 has a light transmitting window 5 which passes the signal light emitted from the semiconductor laser chip 1A and airtightly seals the semiconductor laser chip 1A and the photodiode chip 1B.

A condenser lens 9 secured to a lens holder 10 is used to cause the signal light emitted from the semiconductor laser chip 1A to effectively enter an optical fiber 6 inserted in a housing 8 through a ferrule 7. Especially the structure of FIG. 1 is called coaxial type.

On the other hand, the semiconductor laser device (a second prior art) shown in FIG. 2 is called butterfly type and has a housing 8 of rectangular section. This semiconductor laser device has basically the same function as the first prior art. But it is possible that an IC (integrated circuit) chip for the laser drive circuit and the monitor circuit is mounted on the header 2 secured in the housing 8.

The photodiode chip 1B as the light detecting means comprises, as shown in FIG. 3, an epitaxial layer (semiconductive crystal layer) 12 grown on a semiconductor substrate 11, and a diffusion region 13 formed on the surface of the epitaxial layer 12 by thermal diffusion of a metal element and having an opposite polarity to that of the epitaxial layer 12.

The interface between the epitaxial layer 12 and the diffusion region (first region) 13 have a pn junction, so that the light radiated to the pn junction contributes to the generation of a photocurrent. The generated photocurrent is taken outside for monitor through electrodes 14, 17.

FIGS. 4 and 5 respectively show a top view and an X—X sectional view of a structure of the photodiode chip 1B described above (FIG. 3). As shown, in the photodiode chip 1B, a semiconductive crystal layer 12 of a first conductivity type including a light absorption layer is laminated on a surface of a semiconductor substrate 11 of a first conductivity type having an electrode 17 of the first conductivity type formed on an underside there, and impurities are selectively diffused into the semiconductive crystal layer 12 to form a first region 13 of the second conductivity type. This is a pin photodiode structure where the semiconductor substrate 11 is an n layer (or a p layer), the semiconductive crystal layer 12 is an i layer and the first region 13 is a p layer (or an n layer), and a photo-sensing region is formed in the i layer. An electrode 14 of a second conductivity type is formed on the first region 13 on the surface of the semiconductor crystal layer 12, and the first region 13 inside the electrode 14 is covered with an anti-reflection film 16 while the semiconductive crystal layer 12 outside the electrode 14 is covered with a protection film (i.e. passivation film) 15.

When a reverse bias is applied to the semiconductor device thus constructed, a depletion layer is created in a pn junction area in the semiconductive crystal layer 12. Thus, an electric field is developed in the depletion layer and electrons and holes generated by a light applied to the photo-sensing region 18 are directed to the first conductivity type semiconductor substrate 11 and the second conductivity type region 13, respectively, and accelerated thereby. In this manner, a photocurrent is taken out and a light signal is detected.

In the structure shown in FIGS. 4 and 5, when the light is applied to the photo-sensing region 18, light generating carriers are captured by the depletion layer and a good response characteristic is offered. However, when the light is directed to the outside of the region 18, the generated carriers reach the pn junction while they are diffused by a density gradient and are taken out as a photocurrent. As a result, the response characteristic is adversely affected. FIG. 6 shows a response characteristic of the photodiode chip 1B. Since the movement of the carriers by the diffusion is slow, a response waveform for a light pulse includes a tail at the end as shown in FIG. 6.

When such a photodiode chip 1B is used for the light communication, a light emitted from an optical fiber is condensed so that it is directed to the photo-sensing region 18. However, when a portion of light leaks out of the photo-sensing region 18, it leads to the reduction of the response speed of the photodiode chip 1B by the reason described above. In a high speed photodiode chip, the area of the photo-sensing region 18 is reduced to reduce a junction capacitance. As a result, a ratio of light directed to the outside of the photo-sensing region 18 increases and a diffused component which has a low response speed increases. This leads to the degradation of the response speed.

When the light emitted from a rear end plane of the semiconductor laser device is sensed by the photodiode chip 1B to feedback-control a drive current for the semiconductor laser device in order to keep the light output of the semiconductor laser device at a constant level, if the light emitted from the semiconductor laser spreads to the outside of the photo-sensing region 18 of the photodiode chip 1B, a low response speed component is generated by the diffusion as described above. This adversely affects to the feedback control.

These conventional semiconductor laser devices have the following problems.

The above-described semiconductor laser devices have properties that the semiconductor laser chip 1A as the signal light source tends to have unstable emitted light intensities corresponding to temperature changes. The signal light emitted from the semiconductor laser chip 1A is monitored by the photodiode chip 1B to control an average current to be applied to the semiconductor laser chip 1A to be constant so that a level of the light monitored by the outside electronic circuit is maintained constant.

But to operate the semiconductor laser chip 1A more stably at a high speed above about 100 Mbps, the control of the average current is not sufficient. Actually it is also necessary to detect a minimum emitted light intensity and a maximum one and control a level of the emitted light intensity. But the conventional semiconductor laser devices, which use the photodiode chip 1B of the above-described common structure, cannot accurately detect a minimum and a maximum emitted light intensity, and it is difficult to put the conventional semiconductor laser devices to practical uses.

This is because a photocurrent generated by the light radiated to a part of the surface of the photodiode apart from the light detecting region (pn junction) becomes a slow response component which does not follow a change of an emitted light intensity of a laser beam.

In FIG. 3 reference numeral indicates a divergence of a light beam emitted from the semiconductor laser chip 1A. Carriers generated by those of the beams absorbed in the light detecting region 13 (a light detecting window) on the surface of the photodiode chip 1B and its very neighboring area (e.g., 3~5 μm) are effectively isolated at high speed by an electric field applied to the pn junction and contribute to the generation of a photocurrent. But the signal light absorbed outside the region and the area adversely generate a very slow response photocurrent because the electric field is not applied thereto.

Consequently, in monitoring digital signal light, signal waveform distortions occur (especially a rectangular pulse trails by μsec at the fall), and a maximum and a minimum values cannot be accurately detected. High-speed, stable modulation cannot be performed.

In the conventional semiconductor laser devices, because of this problem, a position of the photodiode chip 1B on the header is finely adjusted so that the signal light emitted from the rear end surface (the lower end surface in FIG. 1) is incident only on the light detecting region of the photodiode chip 1B. A resultant problem is that it takes more time to mount a photodiode chip 1B on the header 2 because the mounting position of the photodiode chip 1B on the header 2 has to be finely adjusted. This problem is a neck to the massproduction.

Although the semiconductor laser device is essential to the optical communication, the device has such problems and cannot be put to all uses, which is a neck to the rapid prevalence of the optical communication systems.

SUMMARY OF THE INVENTION

This invention has been made to solve the above-described problems, and an object of this invention is to provide a semiconductor laser device having a structure which is easy to be fabricated.

This invention relates to a semiconductor laser device in which a housing with an optical fiber inserted in is secured to a header with a semiconductor laser chip mounted on is integrated, the light emitting surface of the semiconductor laser chip and the end surface of the optical fiber are opposed to each other, and there is provided a photodiode chip for detecting the signal light emitted from the backside (rear end surface) of the light emitting surface of the semiconductor laser chip, the photodiode chip having a pn junction area, as a photo-sensing region, formed by selectively providing a first region of a second conductivity type in a portion of a semiconductive layer of a first conductivity type. The first region is surrounded by a second region of the second conductivity type formed in a portion of the semiconductive layer, and the second region has the same or deeper depth as or than that of the first region.

Accordingly, even if the light is directed to the outside of the photo-sensing region, the charges are absorbed by the second region and the flow of the charges into the photo-sensing region is prevented. Thus, only the required photocurrent is taken out to an external circuit.

It is further effect of a top-entry type photodiode chip used in a semiconductor laser device of this invention having a pn junction area, as a photo-sensing region, formed by selectively providing a first region of a heavily doped second conductivity type into a portion of a lightly doped semiconductive layer formed on a semiconductor substrate of a heavily doped first conductivity type, characterized in that the first region is surrounded by a second region of the second conductivity type formed in a portion of said semiconductive layer.

According to this invention, the photodiode chip is provided for monitoring an intensity of emitted light from the semiconductor laser chip as the signal light source and includes the charge capturing region for unnecessary carriers. Such photodiode chip can be easily mounted.

The photodiode chip mounted on the semiconductor laser device has the region for capturing unnecessary carriers generated by signal light radiated to an area outside the light detecting region. Even when the signal light from the rear end surface of the semiconductor laser chip is radiated the peripheral area of the light detecting region, no slow response component is generated in the photocurrent signal.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

DETAILED DESCRIPTION OF THE PREFERRED EMBODIMENTS

The semiconductor laser device according to a first embodiment of this invention will be explained with reference to FIGS. 7 to 20.

Figure 7:
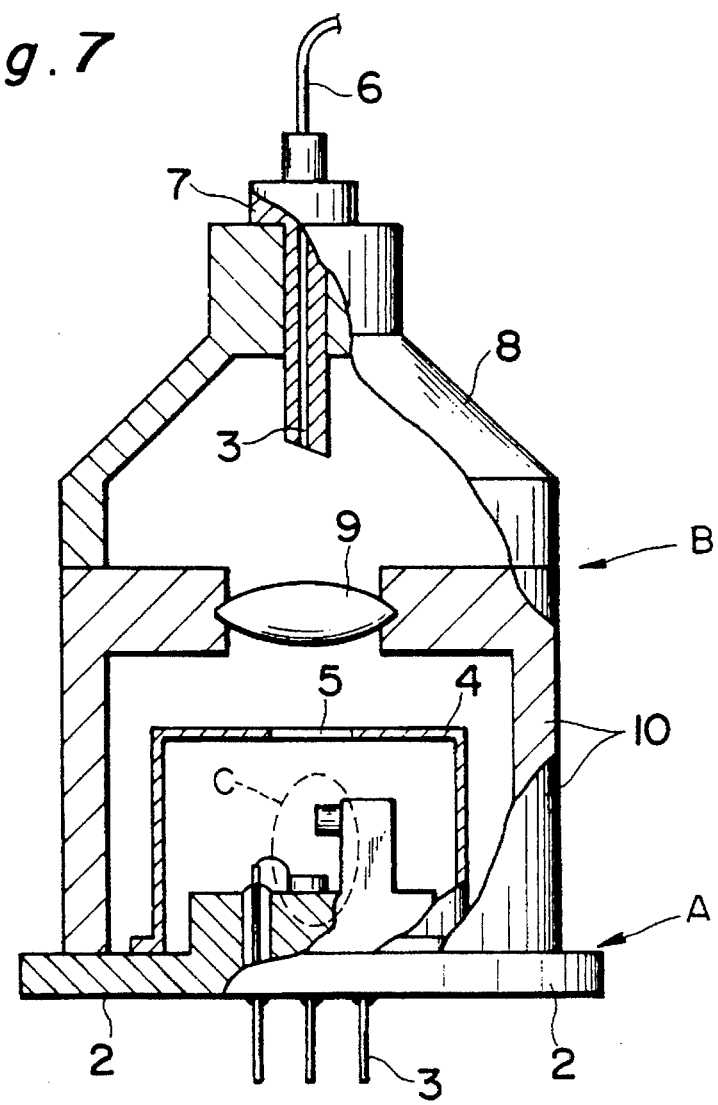
FIG. 7 is a broken side view of the semiconductor laser device according to a first embodiment of this invention.
Figure 8:
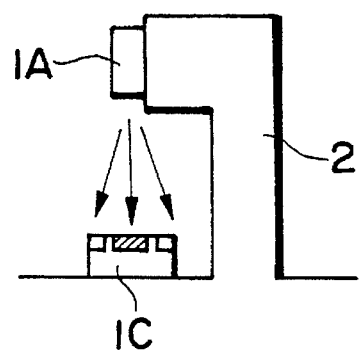
FIG. 8 is a sectional view of major part of the semiconductor laser device according to the first embodiment of this invention.

FIG. 7 is a broken side view of a major part of the semiconductor laser device according to a first embodiment of this invention. FIG. 8 is an enlarged view of the part C in FIG. 7 (the upper part of the header 2).

Figure 1:
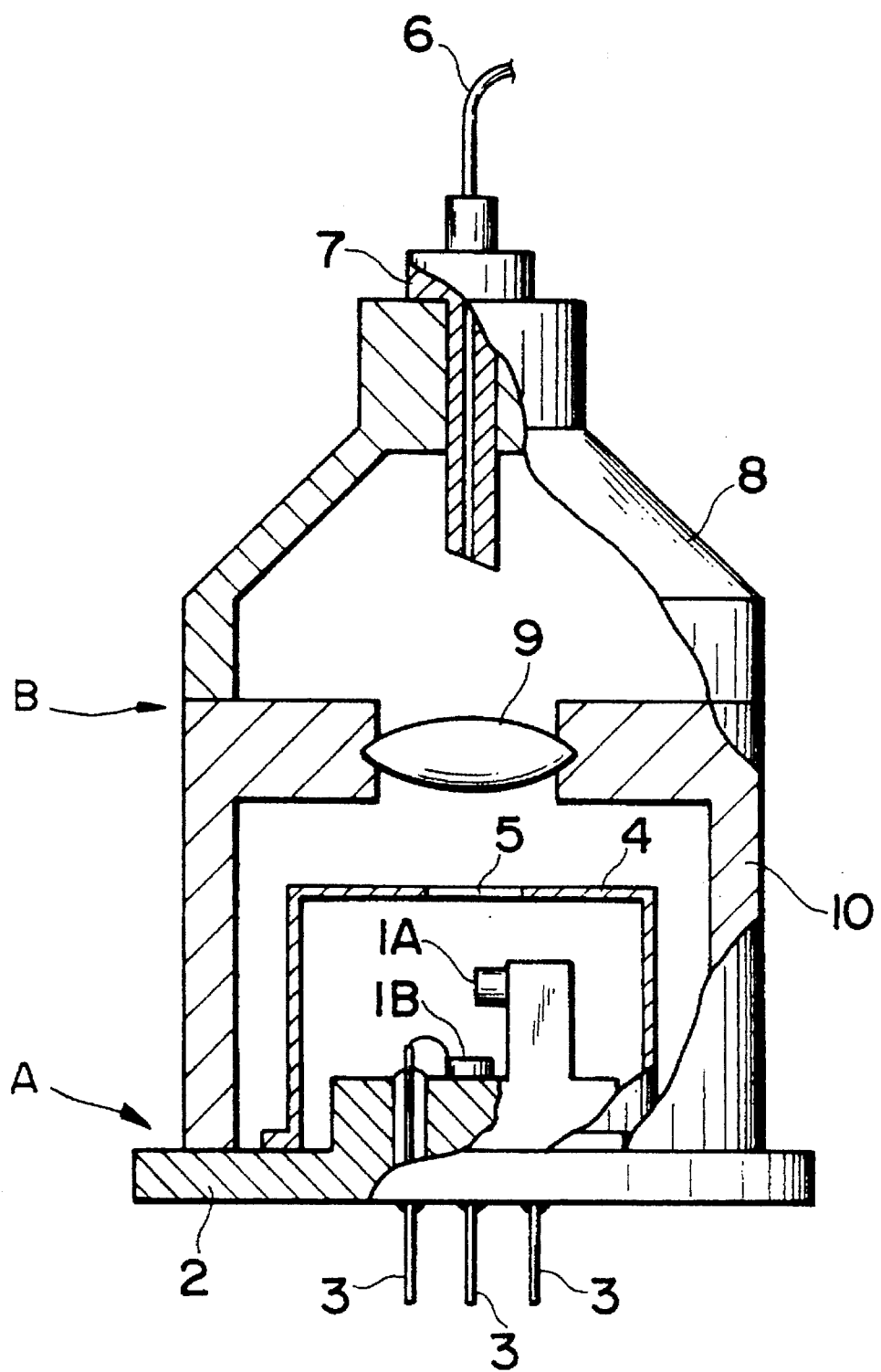
FIG. 1 is a broken side view of a first example of the conventional semiconductor laser device.
Figure 2:
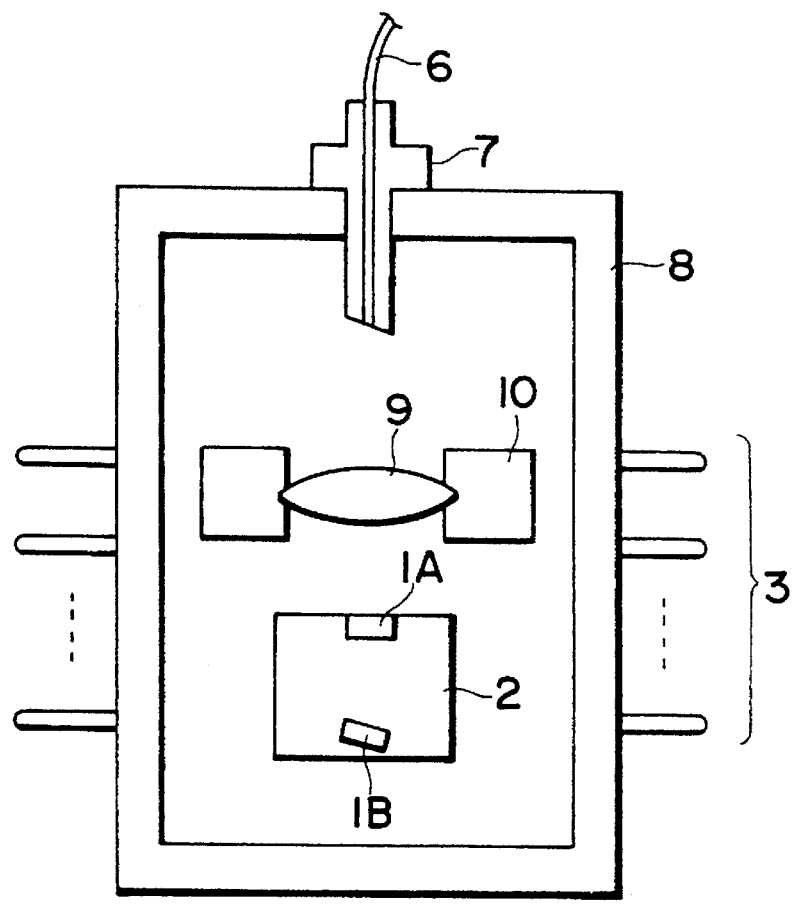
FIG. 2 is a sectional view of a second example of the conventional semiconductor laser device.
Figure 3:
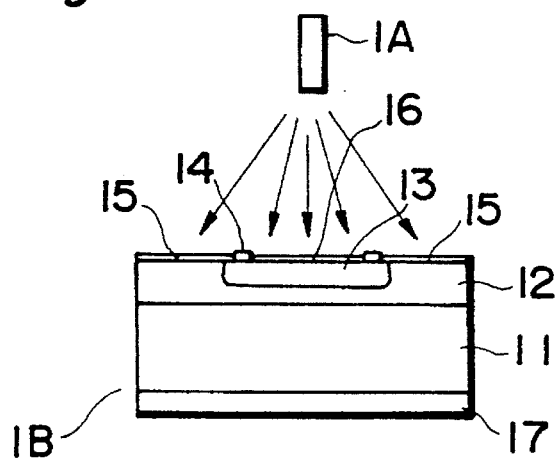
FIG. 3 is a sectional view of a photodiode chip installed in the conventional semiconductor laser devices.
Figure 4:
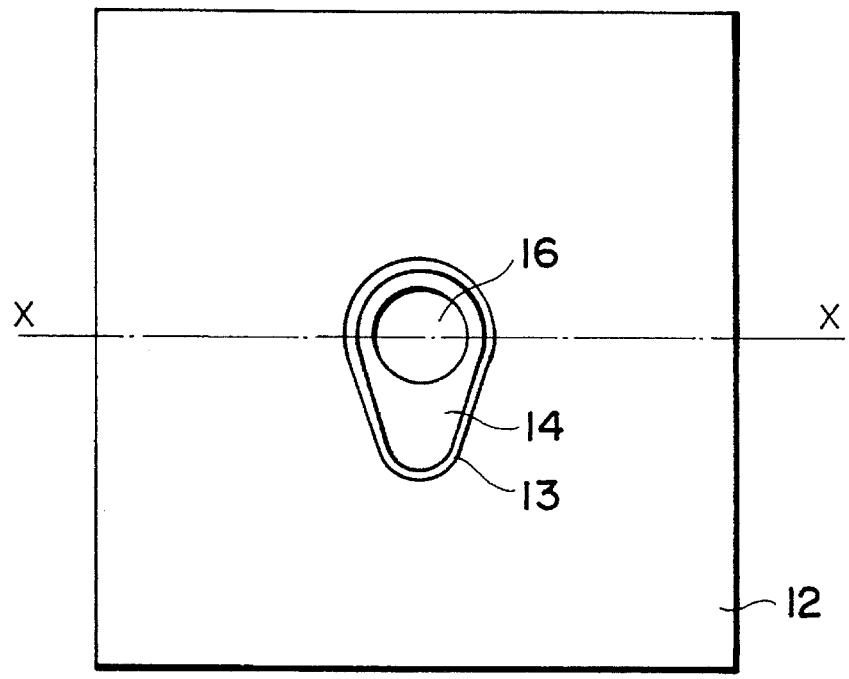
FIGS. 4 and 5 respectively show a structure of a conventional photodiode chip.
Figure 5:
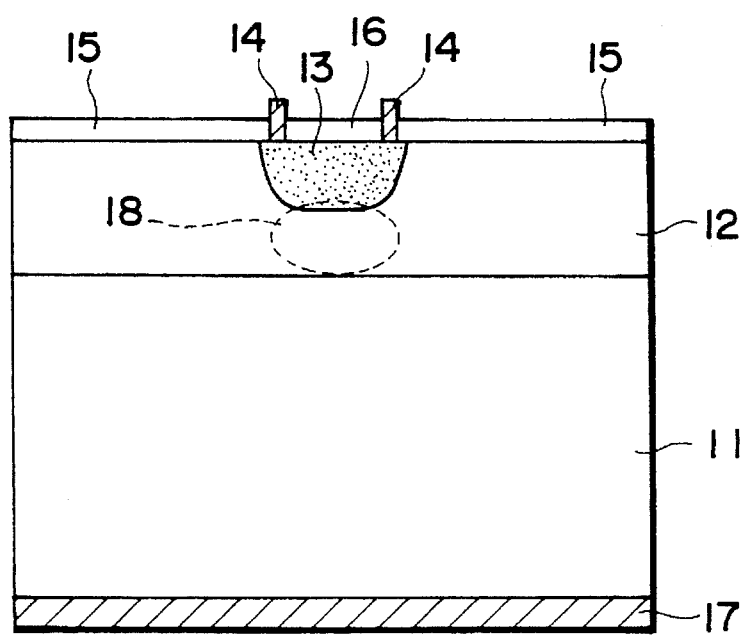
Figure 6:
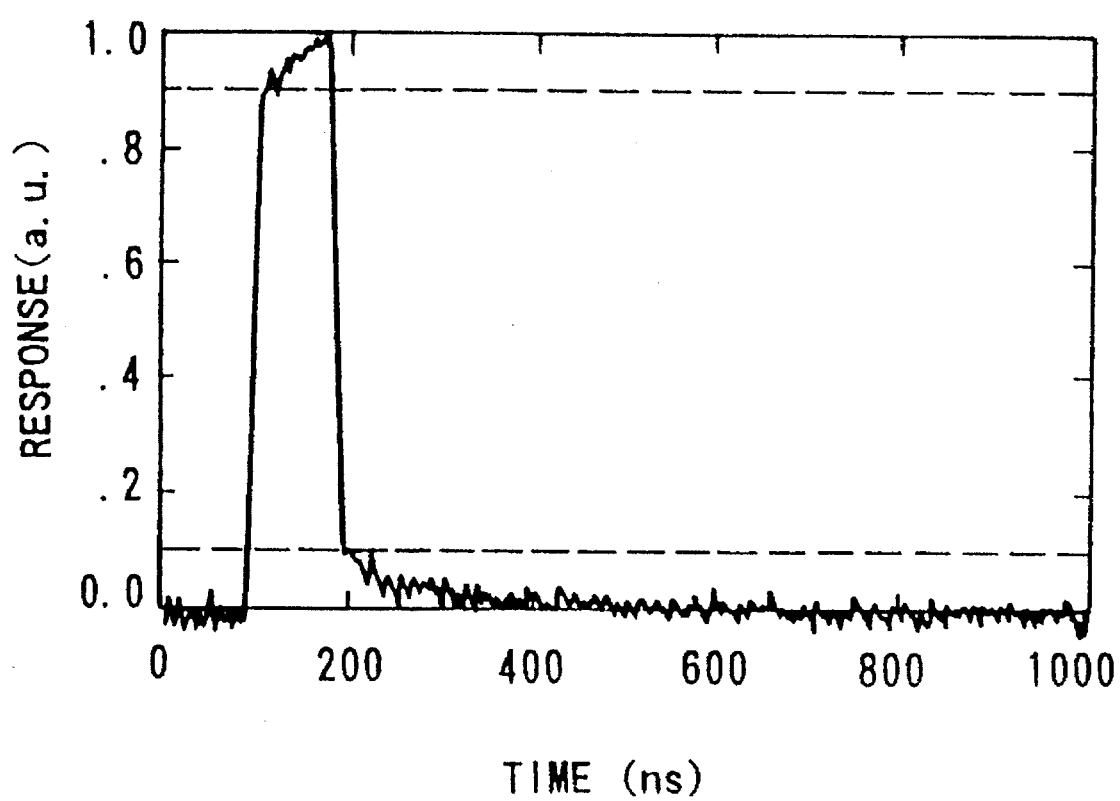
FIG. 6 shows a light pulse response characteristic measured for the conventional photodiode chip shown in FIGS. 4 and 5.

A difference of the conventional semiconductor laser device (FIG. 1) is that the photodiode chip 1C for monitoring the signal light emitted from the rear end surface of the semiconductor laser chip 1A as enlarged in FIG. 8, is provided by a semiconductor of the type (called charge capturing photodiode chip) that a photocurrent generated by the signal light radiated to a peripheral area of the pn junction as the light detecting region is made unreactive.

As shown in FIG. 8, a semiconductor chip 1A is mounted on a header 2, and a semiconductor chip 1C is also mounted on the header 2 on the side of the rear end surface of the semiconductor chip 1A. A lens holder 10 and a housing 8 are integrated with the header 2.

An optical fiber 6 is inserted in the housing 8 through a ferrule 7. The end surface of the optical fiber 5 is opposed to the light emitting surface of the semiconductor laser chip 1A across a lens 9 and a light transmitting window 5.

Figure 9:
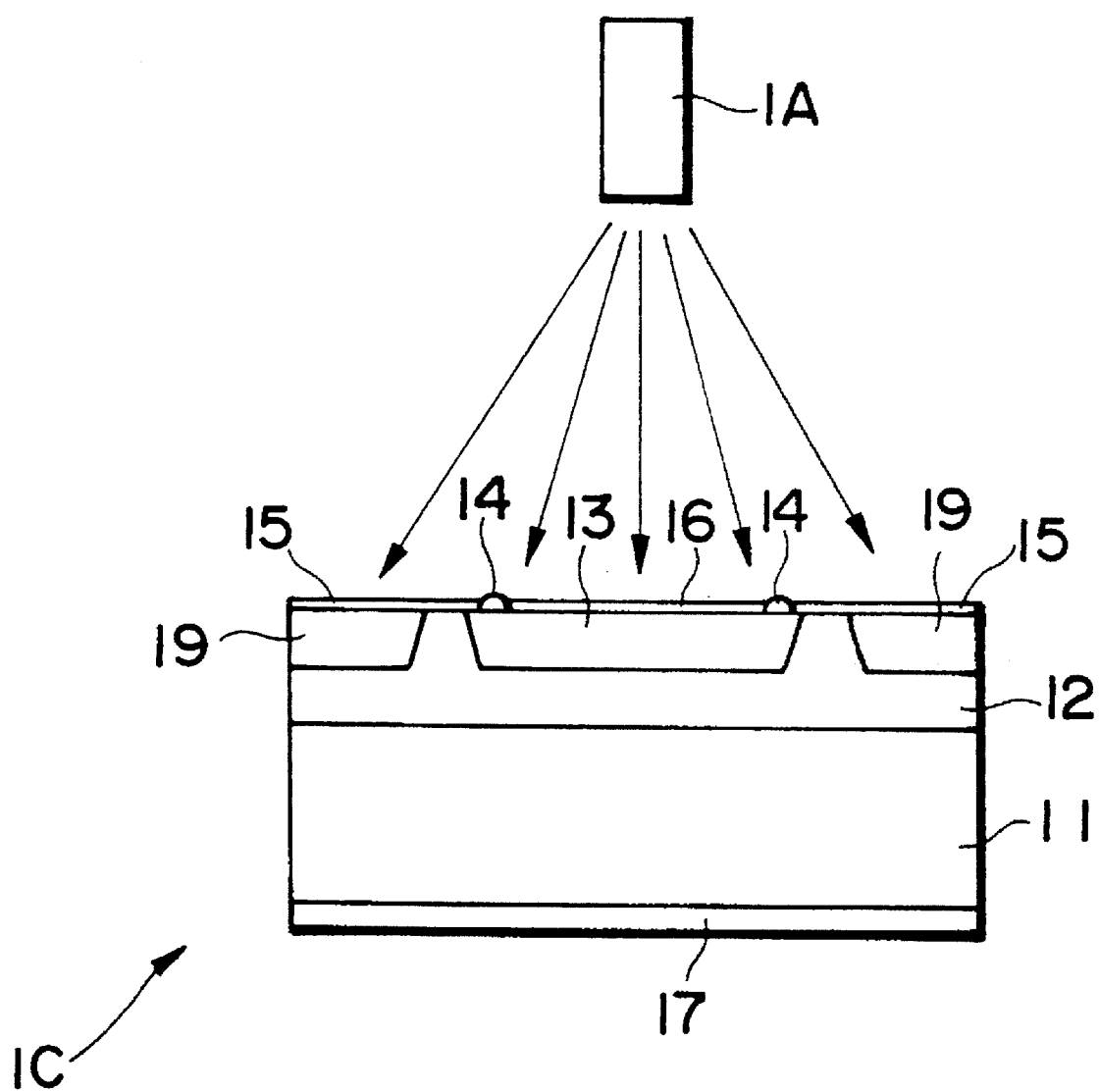
FIG. 9 is a sectional view of a charge capturing photodiode chip used in this invention.

The photodiode chip 1C used in the semiconductor laser device according to this first embodiment of this invention can be provided by a charge capturing photodiode chip of the structure that the photocurrent generated by the light radiated in a peripheral area of the pn junction, i.e., the light detecting region, is made unreactive. One example of the structure is shown in FIG. 9.

A second region 19 having the same polarity as a light detecting region (first region) 13 is formed on an epitaxial layer on a substrate by thermal diffusion of a metal element, whereby the photocarriers generated in the second region 19 do not flow to the light detecting region 13 but extinguish near the pn junction between the epitaxial layer (semiconductive crystal layer) 12 and the region 19, or the pn junction exposed on the end surfaces of the chip.

Figure 10:
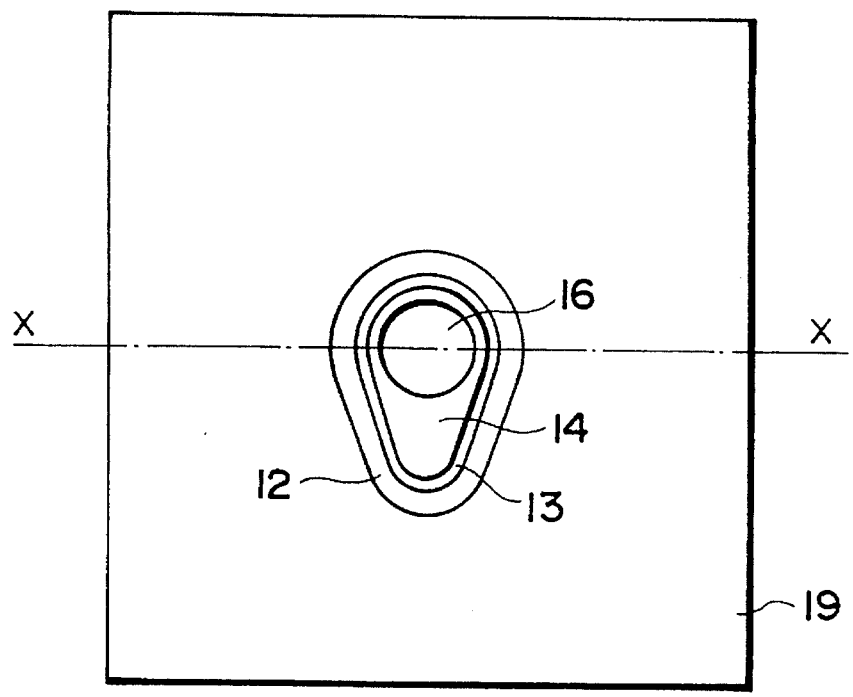
FIGS. 10 and 11 respectively show a basic structure of a charge capturing photodiode chip used in this invention.
Figure 11:
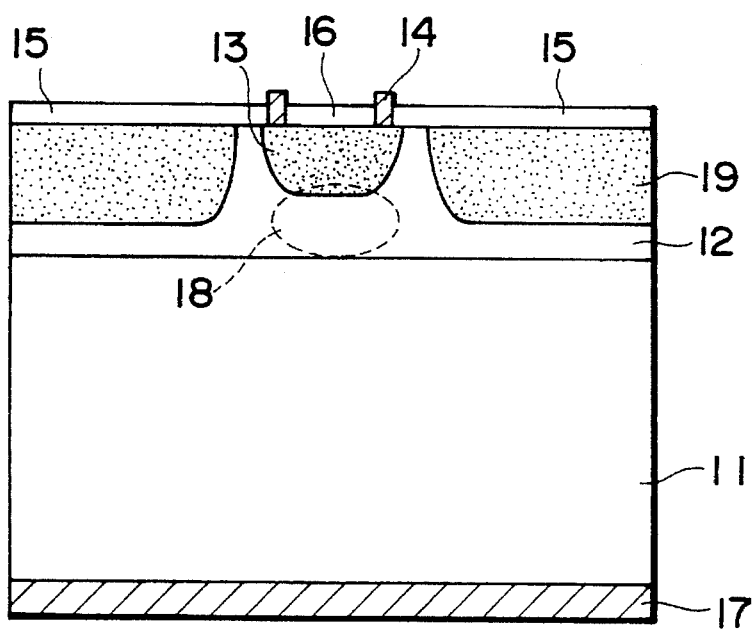

FIGS. 10 and 11 respectively show a basic structure of a photodiode chip 1C used in this invention. FIG. 10 shows a top view and FIG. 11 shows an X—X sectional view. As shown a semiconductive crystal layer 12 of a lightly doped first conductivity type is formed on a surface of a semiconductor substrate 11 of a heavily doped first conductivity type having an n-electrode 17 formed on an underside thereof, and a first region 13 of a second conductivity type is formed in the semiconductive crystal layer 12 by impurity diffusion. A pn junction area formed by the provision of the first region 13 is used as a photo-sensing region 18. The first region 13 is surrounded by the second region 19 of the second conductivity type formed by the impurity diffusion. A p-electrode 14 is formed on the first region 13 on the surface of the semiconductive crystal layer 12, and an anti-reflection film 16 is formed on the first region 13 inside the electrode 14 while a film 15 is formed on the semiconductive crystal layer 12 outside the electrode 14.

In this structure in which the semiconductive crystal layer 12 is used as an i layer of a pin photodiode, generally, the addition of the impurities is not performed in the crystal growth. But the semiconductive crystal layer may become the first conductive type semiconductor layer by locally stoichiometric shift in some kind of the material or by mixture of the impurities from a crystal growing apparatus etc. Further, in order to improve the electrical characteristics of a diode, the impurities may be added in formation of the semiconductor crystal layer 12. Therefore, in the present application, the meaning of "lightly doped" also includes a case that "the intentional addition of the impurities is not performed".

When a reverse bias is applied to the semiconductor device thus constructed, a depletion layer is created in the pn junction area in the semiconductive crystal layer 12. Thus, an electric field is developed in the depletion layer and electrons and holes generated by the light directed to the photo-sensing region 18 are directed to the first conductivity type semiconductor substrate 11 and the second conductivity type region 13, respectively, and accelerated thereby. In this manner, a photocurrent is taken out and a light signal is detected. On the other hand, when the light is directed to the outside of the photo-sensing region 18, undesired carriers are absorbed by a depletion layer created by the second region 19 which is deeply formed in the semiconductive crystal layer 12. Accordingly, only the photocurrent required for the detection of the light signal can be taken out. A structure for absorbing the undesired charges by an impurity layer is disclosed in Japanese Laid-Open Patent Application No. 96719/1978, it teaches the provision of the impurity layer in order to present interference between a photodiode chip and a scan circuit in an image sensor. However, the improvement of the response speed which is the object of the present invention is not attained.

Figure 12:
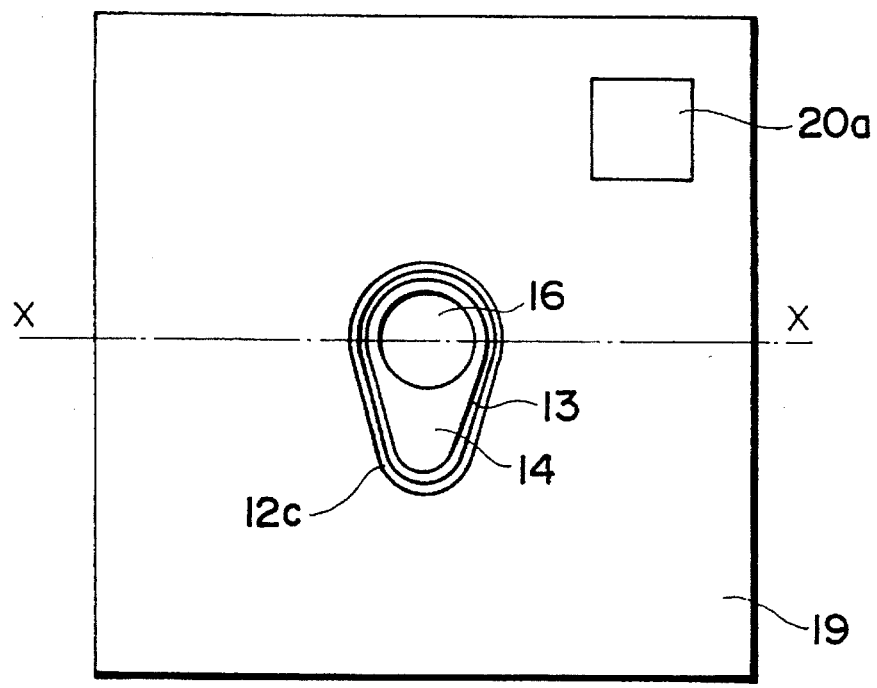
FIGS. 12 and 13 respectively show a first structure of a charge capturing photodiode chip used in this invention.
Figure 13:
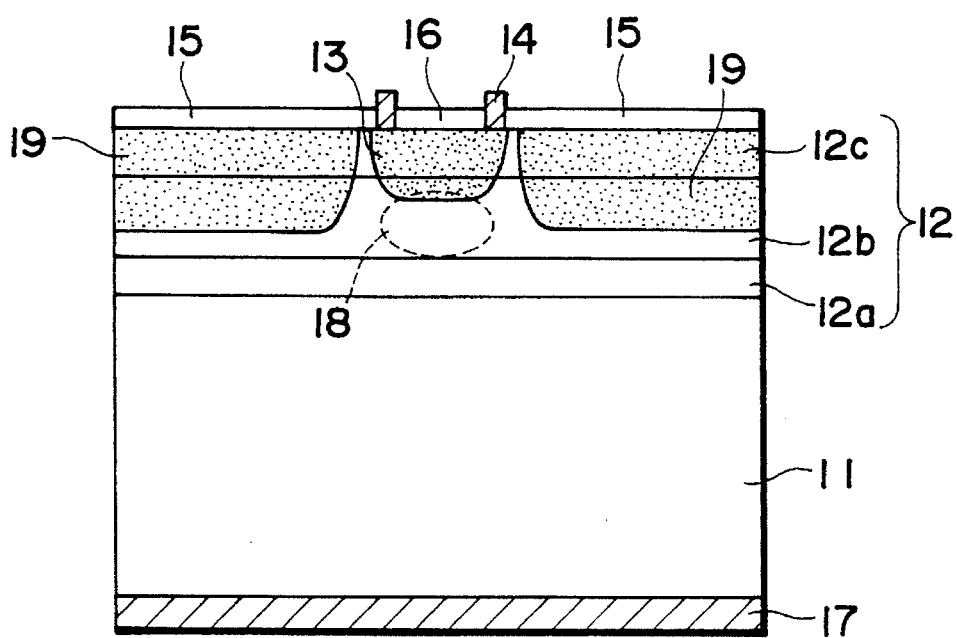

Specific embodiments based on the above basic structure are now explained. FIGS. 12 and 13 respectively show a first structure of a photodiode chip used in this invention. FIG. 12 shows a top view and FIG. 13 shows an X—X sectional view. As shown, an n-type InP buffer layer 12a (dopant concentration n=2×10$^{15}$ cm$^{-3}$, thickness 2 μm), an n type InGaAs (indium-gallium-arsenide) absorbing layer 12b (n=2×10$^{15}$ cm$^{-3}$, thickness 3.5 μm) and an n-type InP window layer 12c (n=2×10$^{16}$ cm$^{-3}$, thickness 2 μm) are formed on a surface of an n$^+$-type Inp (indium-arsenide) semiconductor substrate 11 (n=2×10$^{18}$ cm$^{-3}$) having an n-electrode 17 formed on an underside thereof. A first region 13 and a second region. 19 of a p-type are formed on the photo-sensing layer 12b and the window layer 12c by selective diffusion of Zn (zinc) by a sealed ampoule method (impurity doping method using a sealed silica tube including a semiconductor wafer and an impurity material). A p-electrode 14 is formed on the first region 13 in the semiconductive crystal layer 12, and an anti-reflection film 16 is formed on the region 13 inside the electrode 14 and a protection film 15 is formed outside the electrode 14. An electrode 20a for taking out the charges collected at the second region 19 is formed on the semiconductive crystal layer 12.

Figure 14:
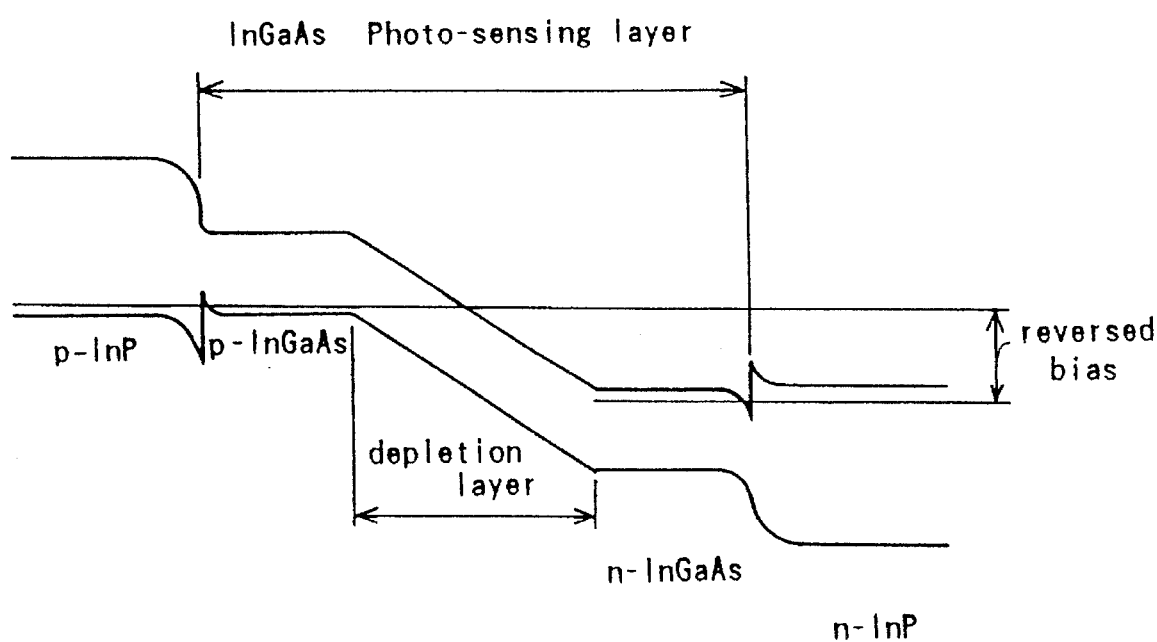
FIG. 14 shows a band gap energy chart of the photodiode chip in FIGS. 12 and 13.

A band gap energy chart of the pin structure is shown in FIG. 14. In this structure, the composition of In Ga As of the absorbing layer 12b is $In_{0.53}Ga_{0.47}As$. This composition provides the smallest band gap energy, that is, can sense the longest wavelength light among the InGaAsP semiconductors which can be lattice-matched with the InP layer.

It is preferable that the thickness of the absorbing layer 12b is between 1 μm and 7 μm to attain efficient absorption of the incident light, although it is not limited thereto. It is further preferable that a width of the n type region between the first region 13 and the second region 19 is between 5 μm and 30 μm to attain good response characteristic and electrical characteristic, although they are not limited thereto. In this structure, a diameter of the first region 13 is 100 μm.

When a light having a wavelength of 1.3 μm is applied to the photodiode chip 1C thus constructed, if the light is directed to the outside of the photo-sensing region 18, undesired charges are collected by the depletion layer created by the second region 19 deeply formed in the semiconductive crystal layer 12 as described above. When the depth of the second region 19 is deeper than that of the first region 13, a capturing effect for extra charges is higher, because the extra charges are generated in the absorbing layer outside the photo-sensing region 18 and diffuse into the photo-sensing region 18 by the density graduation. Accordingly, the second region 19 may be deep enough to reach the buffer layer 12a. However, it is not necessary that the second region 19 is so deep. For example, when the first region 13 and the second region 19 are simultaneously formed, they are of the same depth. In this case, the same effect as that of the present embodiment can be attain. However, when the second region 19 is shallower than the first region 13, the above effect is not attained.

Figure 15:
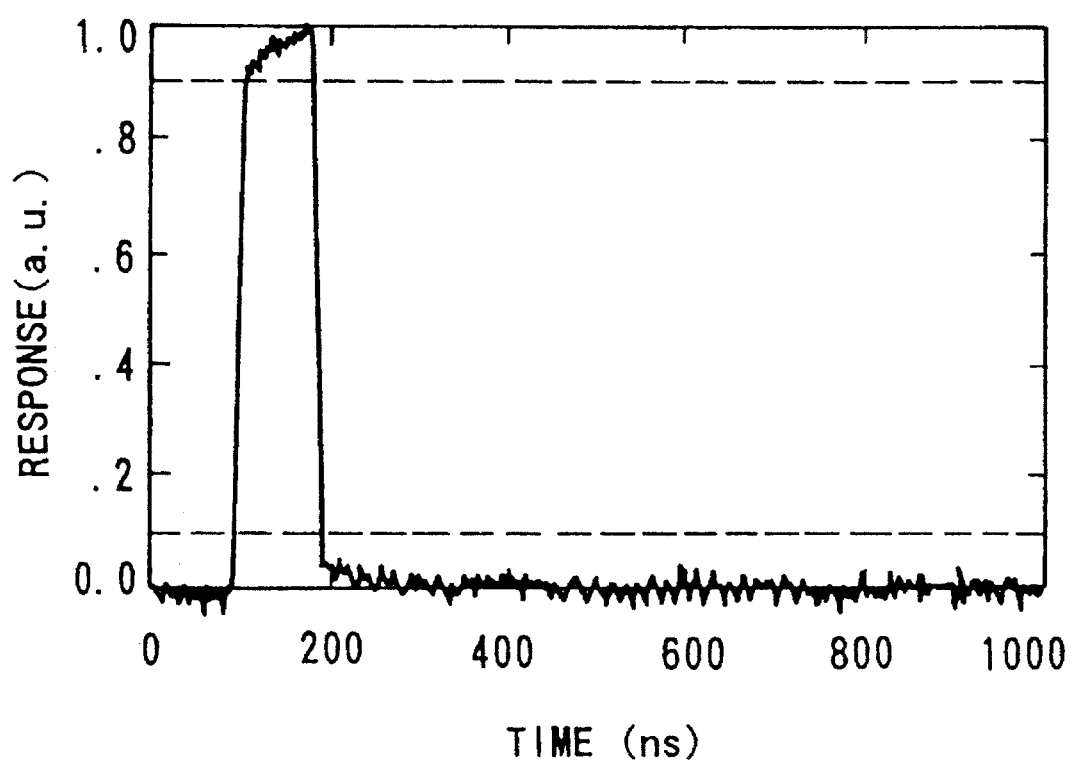
FIG. 15 shows a light pulse response characteristic measured for the photodiode chip in FIGS. 12 and 13.

Only the photocurrent necessary for the detection of the light signal can be take out by the above structure. The response speed of the photodiode chip 1C was measured. As shown in FIG. 15, the end of the waveform includes not tail and no degradation of the response speed by the stray light directed to the outside of the photo-sensing region 18 was confirmed.

In this structure, the incident light has a wavelength of 1.3 μm. Since the photo-sensing layer 12b is the $In_{0.53}Ga_{0.47}As$ layer, the same effect is attained for an incident light of a long wavelength such as 1.55 μm.

Figure 16:
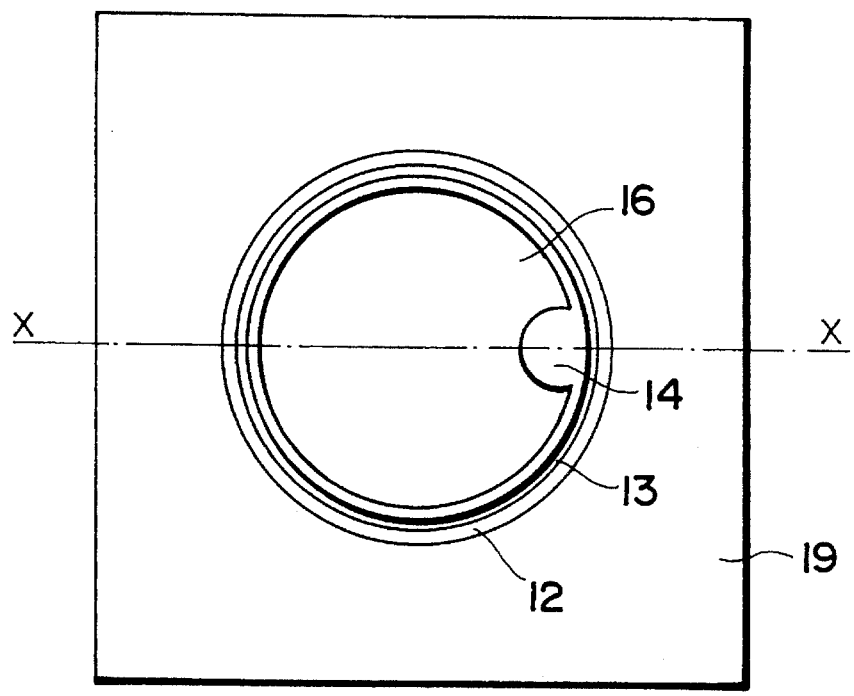
FIGS. 16 and 17 respectively show a second structure of a charge capturing photodiode chip used in this invention.
Figure 17:
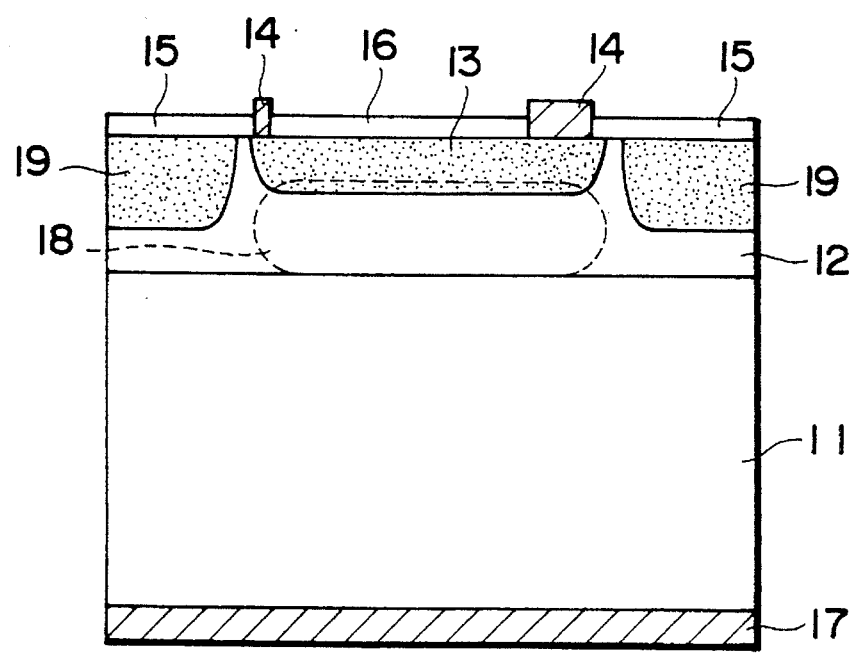

A second structure of photodiode chip 1C is now explained with reference to FIGS. 16 and 17. FIG. 16 shows a top view and FIG. 17 shows an X—X sectional view. In the present structure, an n-type $In_{0.53}Ga_{0.47}As$ absorbing layer (n=1×10$^{15}$ cm$^{-3}$ thickness 5 μm) is formed, as a semiconductive crystal layer 12, on a surface of an n$^+$-type InP substrate 11 having an n- electrode 17 formed on an underside thereof, and a first region 13 and a second region 19 of p type are formed by the selective diffusion of Zn. A diameter of the first region 13 is 300 μm and a width of an n type region between the region 13 and the surrounding second region 19 is 20 μm. A p-electrode 14 is formed on the region 13 of the absorbing layer, and an anti-reflection film 16 is formed on the region 13 inside the electrode 14 and a protection film 15 is formed on the semiconductive crystal layer 12 outside the electrode 14. In this structure, the charges generated by the light directed to the outside of the photo-sensing region are collected to the second region 19 so that the degradation of the response speed is prevented.

Figure 18:
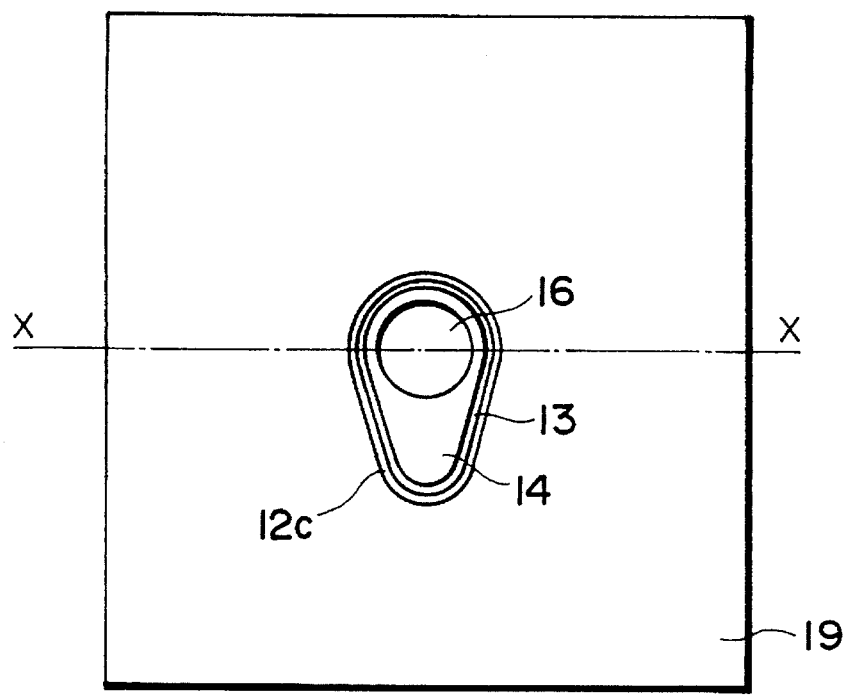
FIGS. 18 and 19 respectively show a third structure of a charge capturing photodiode chip used in this invention.
Figure 19:
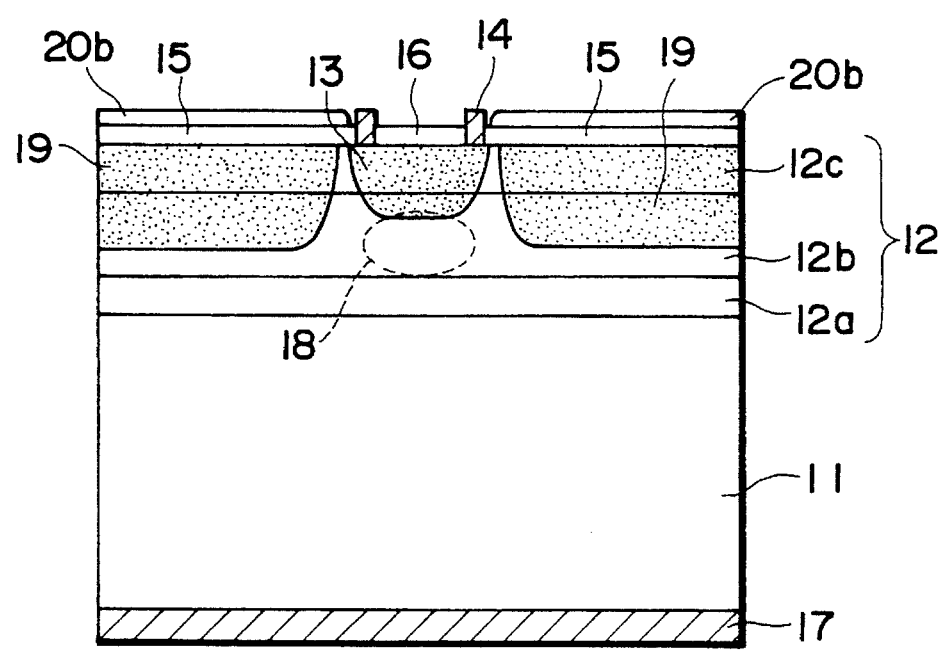

A third structure of a photodiode chip 1C is now explained with reference to FIGS. 18 and 19. FIG. 18 shows a top view and FIG. 19 shows an X—X sectional view. As shown, an n-type InP buffer layer 12a (n=1×10$^{15}$ cm$^{-3}$, thickness 2 μm), an n-type $In_{0.53}Ga_{0.47}As$ absorbing layer 12b (n=2× 10$^{15}$ cm$^{-3}$, thickness 3.5 μm), and an n-type InP window layer 12c (n=2×10$^{16}$ cm$^{16-3}$, thickness 2 μm) are formed on a surface of an n$^+$-type InP semiconductor substrate 11 (n=2×10$^{18}$ cm$^{-3}$) having an n-electrode 17 formed on an underside thereof. Further, a first region 13 and a second region 19 of p-type are formed in the photo-sensing layer 12b and the window layer 12c by the selective diffusion of Zn(zinc) by the sealed ampoule method. A p-electrode 14 is formed on the first region 13 in the semiconductor crystal layer 12, and an anti-reflection film 16 is formed on the region 13 inside the electrode 14 and a device protection film 15 is formed outside the electrode 14. A metal film 20b is formed on the protection film 15 to surround the first region 13. A spacing between the metal film 20b and the p-electrode 14 is maintained at 5 μm.

It is preferable that the thickness of the photo-sensing layer 12b is between 1 μm and 7 μm in order to attain efficient absorption of the incident light, although it is not limited thereto. Further, it is preferable that a diameter of the first region 13 is 100 μm, and the width of the n type region between the first region 13 and the second region 19 is between 5 μm and 30 μm in order to attain good response characteristic and electrical characteristic although it is not limited thereto.

In this structure, since the light directed to the outside of the photo-sensing region 18 is reflected by the metal film 20b, the generation of extra charges is prevented and the degradation of the response speed is effectively prevented.

The semiconductor materials and the dimensions thereof are examples and they change depending on applications and wavelengths. For example, the semiconductor materials may be compound semiconductors such as GaAs (gallium-arsenide), AlGaAs (aluminum-gallium-arsenide), CdTe (cadmium-telluride), HgCdTe (mercury-cadmium-telluride), InSb (indium-antimonide), or Si (silicon) or Ge (germanium). The impurity diffusion may be done by an ion implantation method.

In accordance with the present invention, the degradation of the response speed is prevented by the simple means of depleting a portion of the light absorption region around the photo-sensing region and collecting the charges generated by the light directed to the outside of the photo-sensing region, and the highly sensitive photodiode chip is provided.

By using such improved photodiode chip 1C in monitoring an emitted light intensity, no slow response component of a photocurrent is generated even in a state where a monitored beam from the semiconductor laser chip 1A is divergent. The photodiode chip 1C can be easily mounted, and resultantly semiconductor laser devices can be easily fabricated and can be accordingly inexpensive.

The inventors have fabricated the semiconductor laser device having the structure of FIG. 7.

A 1.3 μm-wavelength InGaAsP semiconductor laser chip 1A and the improved photodiode chip of InGaAs 1C are mounted on a header 2 of Fe for CD lasers. The photodiode chip 1C is electrically connected to a lead 3 with a Au wire.

Then the semiconductor laser chip 1A and the photodiode chip 1C are airtightly sealed by a cap 4 with a light transmitting window 5, and the interior of the cap 4 is filled with nitrogen gas. The condenser lens 9 is provided by a spherical lens. The spherical lens is secured to a stainless holder 10. And this lens is so set by monitoring from above with a TV monitor that the light emitting portion of the semiconductor laser chip 1A is seen at the center of the lens, and next is YAG welded to each other at the part A in FIG. 7 by YAG laser.

Then a housing with an optical fiber 6 inserted through a ferrule 7, and the lens holder 10 are brought nearer to be welded to each other by YAG laser at the part B by monitoring intensities of the incident light on the end surface of the optical fiber 6 for a maximum light intensity.

Figure 20:
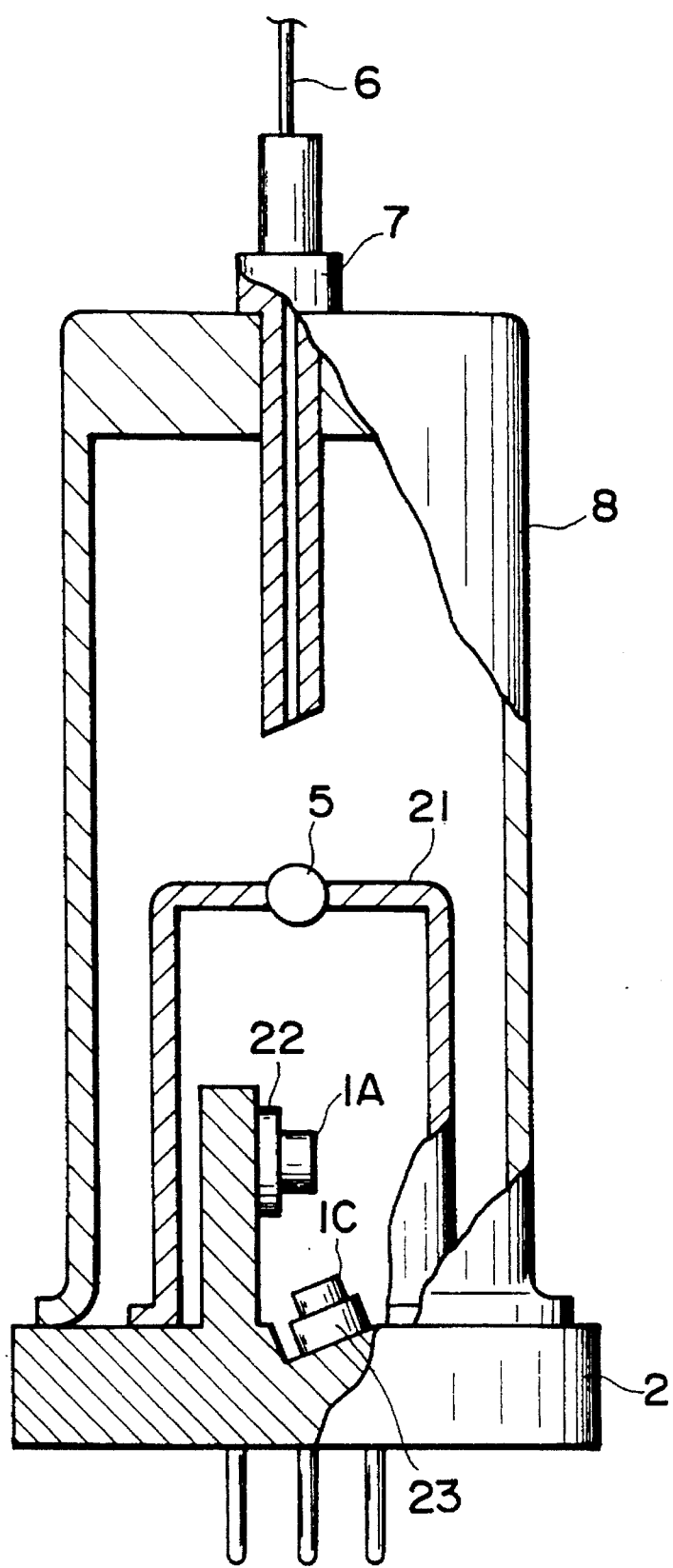
FIG. 20 is a broken side view of the semiconductor laser device according to second embodiment of this invention.

Next, the semiconductor laser device according to a second embodiment of this invention will be explained with reference to FIG. 20.

In this embodiment, a 1.55 μm-wavelength InGaAs semiconductor laser chip 1A is mounted on a Si submount 22 with an AuSn eutectic solder. In the case where the header 2 is provided by a metal package, the Si submount 22 secures the electric insulation between the semiconductor laser chip 1A and the metal package. The Si submount 22 as the header is mounted at a set position on the metal package by an SnPb solder. A photodiode chip 1C is mounted on a position on the header 2 (metal package) where the photodiode chip 1C can detect the light emitted from the rear end surface (lower end surface as view in FIG. 20) of the semiconductor laser chip 1A.

This photodiode chip 1C used in this embodiment has the same structure as that of the photodiode chip 1C used in the embodiment of FIG. 7 that the charge generated by the light radiated to a peripheral area of the light detecting region is captured. Accordingly the positioning of the photodiode chip 1C can be less strict than that of the conventional photodiode chips. This contributes to raise a degree of design freedom of the metal package 2. This photodiode chip 1C is mounted on a submount 23 of alumina ceramics mounted on the metal package with an AuSn eutectic solder. The electrodes of the semiconductor laser chips 1A and of the photodiode chip 1C are electrically connected to set outside electrodes through Au wires.

A metal cap 21 with a spherical lens at the position of the light transmitting window 5 for coupling the signal light emitted from the forward end surface of the semiconductor laser chip 1A with the optical fiber 6 is, by projection welding, secured to the metal package 2 with the semiconductor laser chip 1A mounted on. Then a holder 8 with the optical fiber 6 inserted in is secured to the metal package 2 similarly with projection welding. In securing the cap 21 and the holder 8, aligning means is used so that the light emitted form the semiconductor laser chip 1A is effectively incident on the optical fiber 6. The space airtightly closed by the metal package 2 and the cap 21 and accommodating the semiconductor laser chip 1A is filled with an inert gas, e.g., nitrogen gas, in its dry state, so that even in low temperature conditions the inert gas does not bedew the surfaces of the semiconductor devices. The materials of the semiconductors, the packages and the submounts are one examples, and other different materials can be selected depending on applications.

The improved semiconductor laser device using the thus-improved photodiode chip for monitoring can accurately monitor the state of an emitted laser beam, and resultantly can be stably driven up to high speeds and high temperatures. Furthermore, the positioning of the photodiode can be less strict, and resultantly the photodiode can be mounted easily. The charge capturing region with an antireflection film formed on can absorb unnecessary component of Signal light, and resultantly no reflected light or scattered light, which makes the operation of the semiconductor laser unstable are generated, and resultantly the operation of the semiconductor laser device can be stable.

As described above, according to this invention, the photodiode chip as the monitoring light detecting means is provided by a photodiode chip having the structure having a region for capturing unnecessary carriers, and resultantly the photodiode chip can accurately detect waveforms of laser beams and stably operate even at high speed and at high temperature conditions. In addition, the positioning of the photodiode can be less strict, and resultantly the photodiode can be easily mounted. The charge capturing region with the antireflection film formed on can collect an unnecessary component of signal light, and resultantly no reflection light and scattered light, which makes the operation of the semiconductor laser unstable with signal light, are not generated, and a stable operative semiconductor laser device can be provided.

The semiconductor laser device according to this invention is essential as a component to the machines and instruments especially for the high-speed data transfer and the optical communication subscribers among the communication networks in which the optical communication is being advanced.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor laser device comprising:
   a housing with an optical fiber as an transmission path inserted in;
   a header for securing said housing integrally therewith;
   a semiconductor laser chip mounted on said header, and having a light emitting surface for emitting signal light to an incident end surface of said optical fiber through a lens optical system; and
   a photodiode chip mounted on said header, and including
      a compound semiconductor substrate,
      a cathode electrode provided on a main surface of said compound semiconductor substrate,
      a compound semiconductor layer of a first conductivity type provided on another main surface of said compound semiconductor substrate,
      a first region of a second conductivity type provided in said compound semiconductor layer, a pn junction area being formed by said compound semiconductor layer and said first region, said pn junction functioning as a photosensing region,
      a second region of said second conductivity type surrounding said first region and being spaced from said first region, said second region absorbing carriers generated near said second region in response to incident light, and
      an anode electrode provided on said first region and electrically connected thereto.

2. A photodiode chip according to claim 1, wherein said compound semiconductor layer is made by crystal growth of a semiconductor material having a composition which is the same as that of said compound semiconductor substrate.

3. A photodiode chip according to claim 1, wherein said compound semiconductor layer is a lamination of a plurality of semiconductor layers having lower impurity concentrations than that of said semiconductor substrate, and at least one of said plurality of semiconductive layers, which does not contact said compound semiconductor substrate, has a composition which is different from said compound semiconductor substrate.

4. A photodiode chip according to claim 3, wherein said compound semiconductor substrate is an n$^+$-type InP (indium-phosphoride) substrate, and said semiconductor layer is a lamination of an n-type InP buffer layer, an n-type InGaAs (indium-gallium-arsenide) absorbing layer and an n-type InP window layer, in sequence.

5. A semiconductor laser device according to claim 1, wherein said optical fiber and said semiconductor laser chip are incontiguously optically coupled with each other through said lens optical system, an incident end surface of said optical fiber and a light emitting surface of said semiconductor laser are opposed to each other.

6. A semiconductor laser device according to claim 1, wherein said semiconductor laser chip and said photodiode chip are incontiguously optically coupled with each other, and a backside of a light emitting surface of said semiconductor laser chip and a light detecting surface of said photodiode chip are opposed to each other.

7. A semiconductor laser device according to claim 1, wherein said semiconductor laser chip and said photodiode chip both mounted on said header is airtightly sealed with a cap, and an interior of said cap is filled with an inert element.

8. A semiconductor laser device according to claim 1, wherein said cap has a light transmitting window for passing a signal light emitted from an emitting surface of said semiconductor laser chip.

9. A semiconductor laser device comprising:

a housing with an optical fiber as an optical transmission path inserted in;

a header securing said housing integrally therewith;

a semiconductor laser chip mounted on said header, and having a light emitting surface for emitting signal light to an incident end surface of said optical fiber through a lens optical system; and a photodiode chip mounted on said header, and including a compound semiconductor substrate of a highly doped first conductivity type, a low doped compound semiconductor layer provided on a front surface of said compound semiconductor substrate, a first region of a highly doped second conductivity type provided in said low doped semiconductor layer, a pn junction functioning as a photo-sensing region being formed by said first region and said low doped semiconductor layer, a second region of said second conductivity type surrounding said first region and being spaced from said first region, and a cathode electrode provided on a back surface of said compound semiconductor substrate.

10. A semiconductor laser device according to claim 9, wherein said optical fiber and said semiconductor laser chip are incontiguously optically coupled with each other through said lens optical system, an incident end surface of said optical fiber and a light emitting surface of said semiconductor laser are opposed to each other.

11. A semiconductor laser device according to claim 9, wherein said semiconductor laser chip and said photodiode chip are incontiguously optically coupled with each other, and a backside of a light emitting surface of said semiconductor laser chip and a light detecting surface of said photodiode chip are opposed to each other.

12. A semiconductor laser device according to claim 9, wherein said semiconductor laser chip and said photodiode chip both mounted on said header is airtightly sealed with a cap, and an interior of said cap is filled with an inert element.

13. A semiconductor laser device according to claim 12, wherein said cap has a light transmitting window for passing a signal light emitted from an emitting surface of said semiconductor laser chip.

14. A semiconductor laser device comprising:

a housing with an optical fiber as an optical transmission path inserted in;

a header securing said housing integrally therewith;

a semiconductor laser chip mounted on said header through a Si submount, and having a emitting surface for emitting signal light to an incident end surface of said optical fiber through a lens optical system; and a photodiode chip mounted on said header, and including a compound semiconductor substrate, a cathode electrode provided on a main surface of said compound semiconductor substrate, a compound semiconductor layer of first conductivity type provided on another main surface of said compound semiconductor substrate, a first region of a second conductivity type provided in said compound semiconductor layer, a pn junction area being formed by said compound semiconductor layer and said first region, said pn junction functioning as a photo-sensing region, a second region of said second conductivity type surrounding said first region and being spaced from said first region, said second region absorbing carriers generated near said second region in response to incident light, and an anode electrode provided on said first region and electrically connected thereto.

15. A photodiode chip according to claim 14, wherein said compound semiconductor layer is made by crystal growth of a semiconductor material having a composition which is the same as that of said compound semiconductor substrate.

16. A photodiode chip according to claim 14, wherein said compound semiconductor layer is a lamination of a plurality of semiconductor layers having lower impurity concentrations than that of said semiconductor substrate, and at least one of said plurality of semiconductor layers, which does not contact said compound semiconductor substrate has a composition which is different from said compound semiconductor substrate.

17. A photodiode chip according to claim 16, wherein said compound semiconductor substrate is an n$^+$-type InP (indium-phosphoride) substrate, and said semiconductor layer is a lamination of an n-type InP buffer layer, an n-type InGaAs (indium-gallium-arsenide) absorbing layer and an n-type InP window layer, in sequence.

18. A semiconductor laser device according to claim 14, wherein said lens optical system is provided by a spherical lens.

19. A semiconductor laser device according to claim 14, wherein said header securing said semiconductor laser chip through a Si submount is provided by a metal package.

20. A semiconductor laser device according to claim 14, wherein said optical fiber and said semiconductor laser chip are incontiguously optically coupled with each other through said lens optical system, and an incident end surface of said optical fiber and a light emitting surface of said semiconductor laser chip are opposed to each other.

21. A semiconductor laser device according to claim 14, wherein said semiconductor laser chip and said photodiode chip are incontiguously optically coupled with each other, and a backside of a light emitting surface of said semiconductor laser chip and a light detecting surface of said photodiode chip are opposed to each other.

22. A semiconductor laser device according to claim 14, wherein said semiconductor laser chip and said photodiode chip both mounted on said header is airtightly sealed with a cap, and an interior of said cap is filled with an inert element.

23. A semiconductor laser device according to claim 22, wherein said cap has a light transmitting window for passing a signal light emitted from a light emitting surface of said semiconductor laser chip.

24. A semiconductor laser device comprising:

a housing with an optical fiber as an optical transmission path inserted in;

a header securing said housing integrally therewith;

a semiconductor laser chip mounted on said header through a Si submount, and having a emitting surface for emitting signal light to an incident end surface of said optical fiber through a lens optical system; and a photodiode chip mounted on said header, and including a compound semiconductor substrate of a highly doped first conductivity type, a low doped compound semiconductor layer provided on a front surface of said compound semiconductor substrate, a first region of a highly doped second conductivity type provided in said low doped semiconductor layer, a pn junction functioning as a photo-sensing region being formed by said first region and said low doped semiconductor layer, a second region of said second conductivity type surrounding said first region and being spaced from said first region, and a cathode electrode provided on a back surface of said compound semiconductor substrate.

25. A semiconductor laser device according to claim 24, wherein said lens optical system is provided by a spherical lens.

26. A semiconductor laser device according to claim 24, wherein said header securing said semiconductor laser chip through a Si submount is provided by a metal package.

27. A semiconductor laser device according to claim 24, wherein said optical fiber and said semiconductor laser chip are incontiguously optically coupled with each other through said lens optical system, and an incident end surface of said optical fiber and a light emitting surface of said semiconductor laser chip are opposed to each other.

28. A semiconductor laser device according to claim 24, wherein said semiconductor laser chip and said photodiode chip are incontiguously optically coupled with each other, and a backside of a light emitting surface of said semiconductor laser chip and a light detecting surface of said photodiode chip are opposed to each other.

29. A semiconductor laser device according to claim 24, wherein said semiconductor laser chip and said photodiode chip both mounted on said header is airtightly sealed with a cap, and an interior of said cap is filled with an inert element.

30. A semiconductor laser device according to claim 29, wherein said cap has a light transmitting window for passing a signal light emitted from a light emitting surface of said semiconductor laser chip.

* * * * *